United States Patent
Kawarabayashi et al.

(10) Patent No.: US 6,434,722 B2
(45) Date of Patent: *Aug. 13, 2002

(54) METHOD OF CHANGING LOGIC CIRCUIT PORTION INTO GATED CLOCK PORTION AND RECORDING MEDIUM STORING A PROGRAM FOR CARRYING OUT THE METHOD

(75) Inventors: Masamichi Kawarabayashi, Tokyo; Takuo Nakaki, Kanagawa, both of (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,656

(22) Filed: Apr. 20, 1998

(30) Foreign Application Priority Data

Apr. 18, 1997 (JP) ............................. 9-101189

(51) Int. Cl.[7] ............................. G06F 17/50; G06F 9/45
(52) U.S. Cl. ..................... 716/3; 716/2; 716/4; 716/6; 716/1
(58) Field of Search ................................. 395/555, 559, 395/500.02, 500.07, 500.4; 716/3

(56) References Cited

U.S. PATENT DOCUMENTS

| | | | | |
|---|---|---|---|---|
| 5,452,239 A | * | 9/1995 | Dai et al. | 364/578 |
| 5,504,910 A | * | 4/1996 | Wisor et al. | 395/750 |
| 5,526,276 A | * | 6/1996 | Cox et al. | 364/489 |
| 5,644,499 A | * | 7/1997 | Ishii | 364/489 |
| 5,649,176 A | * | 7/1997 | Selvidge et al. | 395/551 |
| 5,721,690 A | * | 2/1998 | Asaka | 364/489 |
| 5,754,837 A | * | 5/1998 | Walsh et al. | 395/555 |
| 5,801,955 A | * | 9/1998 | Burgun et al. | 364/489 |
| 5,831,866 A | * | 11/1998 | Burgun et al. | 364/488 |
| 5,841,663 A | * | 11/1998 | Sharma et al. | 364/490 |
| 5,864,487 A | * | 1/1999 | Merryman et al. | 364/491 |
| 5,956,256 A | * | 9/1999 | Rezek et al. | 716/3 |

FOREIGN PATENT DOCUMENTS

JP 10-283381 10/1998

OTHER PUBLICATIONS

P. A. Subrahmanyam et al., Specification and Synthesis of Mixed–Mode Systems: Experiments in a VHDL Environment, Proceedings of 1993 IEEE Conference on Computer Design: VLSI in Computers and Processors, 1993, pp. 235–241.*

Ishii, A. T., Retiming Gated–Clocks and Precharged Circuit Structures, 1993 IEEE/ACM International Conference on Computer–Aided Design, ICCAD–93. Digest of Technical Papers., pp. 300–307, Jul. 1993.*

Martin, Hans–Georg, Retiming by Combination of Relocation and Clock Delay Adjustment, IEEE Comput. Soc. Press, Proceedings EURO–DAC, European Design Automation Conference with EURO–VHDL 1993, pp. 384–389, Jan. 1993.*

* cited by examiner

*Primary Examiner*—Matthew Smith
*Assistant Examiner*—A. M. Thompson
(74) *Attorney, Agent, or Firm*—Foley & Lardner

(57) ABSTRACT

A method designs a logic circuit having a flip-flop which performs an on and off operation in response to a timing clock and a feedback loop. With such a structure, a logic circuit portion which operates in accordance with an enable signal automatically is extracted. Further, the logic circuit portion is formed by the use of a gated clock obtained by gating the timing clock via the enable signal. Thereby, the number of on and off operations of the flip-flop in response to the timing clock can be largely reduced.

5 Claims, 5 Drawing Sheets

METHOD OF CHANGING LOGIC CIRCUIT PORTION INTO GATED CLOCK PORTION AND RECORDING MEDIUM STORING A PROGRAM FOR CARRYING OUT THE METHOD

BACKGROUND OF THE INVENTION

This invention relates to a method of designing a large-scale integrated LSI circuit, and in particular, to circuit design method using a logic synthesis technique.

Generally, as the LSI has been increased in size with a high speed, a circuit design method using the known EDA (electronic design automation) tool has increasingly became important. Such a circuit design method is normally classified into five phases, namely, (1) a system design, (2) a function/logic design, (3) a layout design, (4) a test design, and (5) a macrocell design.

In the function/logic design phase among the above phases, the LSI to be designed is expressed as a resistor or a combination between the resistors. In this event, the known RTL (register transfer level) description which is obtained in the system design phase is expressed by the use of a hardware description language, such as the known VHDL, to obtain a logic circuit net list of a gate level.

In this case, a constraint, a truth table, a logic equation and a state transition description and like are given as inputs in the function/logic design phase. Further, a state code of a state machine is assigned, a flip-flop is assigned and further, a combination logic is generated. Consequently, the logic circuit is generated as the gate level.

In this event, the logic circuit of the gate level which is used in the function/logic phase includes a variety of logic circuits. Under the circumstances, when the logic synthesis is directly carried out for the logic circuit which is described by the use of the VHDL, the constraints are often satisfied.

To this end, the logic is optimized within the range independent of a semiconductor manufacturing technology. Thereby, the number of the logic gates (chip area) and the number of logic stages are suitably adjusted so as to satisfy the constraints which are requested by an user. In such an adjustment, a redundant logic is eliminated, a logic is opened, and a multi-stage is carried out by the use of a nature of Boolean algebra. Finally, a mapping process is performed for the semiconductor manufacturing technology.

Herein, a low power consumption and a small chip are often considered as the constraint in the LSI. Conventionally, it is normal that the constraint, such as the power consumption and the chip area, is manually applied when the number of the logic gates and the number of the logic stages are adjusted. Consequently, the above conventional technique requires enough time to design the circuit.

On the other hand, the logic circuit to be designed includes, for example, a plurality of logic circuits each of which retains a signal value under a predetermined condition and inputs data signal under the other condition. In this event, this logic circuit is expressed by the use of a specific description, such as the VHDL. The logic circuit is logically synthesized by a combination of a multiplexer, a delay flip-flop and a feedback loop. Herein, the multiplexer operates by receiving an enable signal and a data signal. The flip-flop is connected to the multiplexer and is turned on and off in response to a timing clock. Further, the feedback loop is connected between the delay flip-flop and the multiplexer.

As mentioned before, the delay flip-flop repeats its on and off operations every time the timing clocks are supplied to the logically synthesized combination of the multiplexer, the delay flip-flop and the feedback loop. Generally, electrical power is largely consumed when the delay flip-flop repeats the on and off operations. Consequently, the above logically synthesized logic circuit must be manually adjusted so as to reduce the power consumption of the logic circuit.

SUMMARY OF THE INVENTION

It is therefore an object of this invention to provide a circuit design method which is capable of designing a circuit in a short time.

It is another object of this invention to provide a circuit design method which is capable of realizing a lower power consumption.

It is still another object of this invention to provide a circuit design method which is applicable for a logic circuit having a feedback loop.

It is the other object of this invention to provide a circuit design method which is applicable for a logic circuit which retains a signal value under a predetermined condition and inputs a data signal under the other condition.

It is the other object of this invention to provide a circuit design method which is capable of realizing a lower power consumption and a small chip area by preventing a change due to unnecessary timing clocks.

A method of this invention designs a circuit having a flip-flop which performs an on and off operation in response to timing clocks and a feedback loop.

With such a structure, a logic circuit portion which operates in accordance with an enable signal automatically is extracted. Further, the logic circuit portion is formed by the use of gated clock. In this event, the timing clock is gated by the enable signal. Consequently, the number of on and off operations of the flip-flop in response to the timing clock can be largely reduced.

Thus, according to this invention, the logic circuit having a lower power consumption can be obtained with a simple operation by automatically generating the logic circuit which is formed by the use of the gated clock. This also means that the circuit having a small chip area can be structured.

DESCRIPTION OF THE PREFERRED EMBODIMENTS

Figure 1:
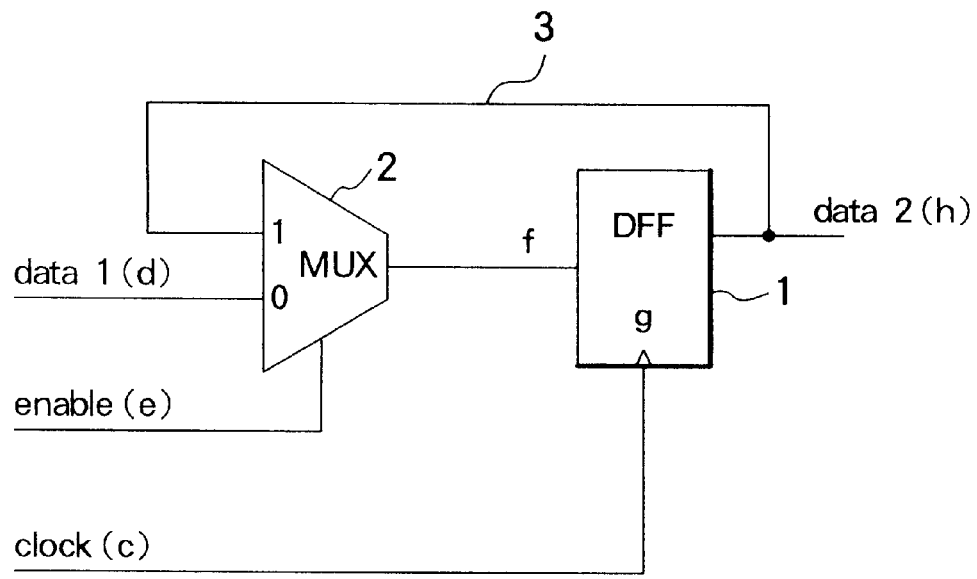
FIG. 1 shows a structure of a logic circuit according to this invention.
Figure 2:
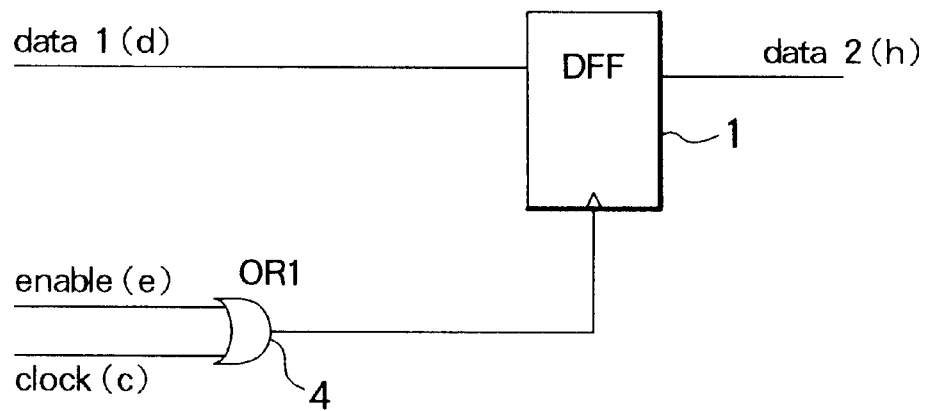
FIG. 2 is a circuit diagram for explaining a principle of this invention in relation to FIG. 1.

Referring to FIGS. 1 and 2, description will be made about a principle of this invention.

Before explaining FIGS. 1 and 2, it is assumed that a logic relation between hardware is specified by the following description by the use of the hardware description language VHDL.

if (clock 'event and clock=1') then
        if (enable='0') then
            data2<=data1:
        endif:
endif:

As illustrated in FIG. 1, a circuit which is logically synthesized on the basis of the above-mentioned description is structured by a combination of a delay flip-flop 1 (DFF) and a multiplexer 2 (MUX). Further, the delay flip-flop (DFF) and the multiplexer (MUX) are connected to each other via feedback loop 3. More specifically, the multiplexer 2 (MUX) in the logically synthesized circuit is given data. (namely (d)) and data 2 (,namely (h)) which is fed back from the delay flip-flop 1 (DFF).

With such a structure, when an enable signal (e) is equal to a logic "1", the data 2 (h) is selected. On the other hand, when the enable signal (e) is equal to a logic "0", the data 1 is selected to to be supplied to the delay flip-flop 1 (DFF) as a signal f. A timing clock (clock), namely, (c) is given to the delay flip-flop 1 (DFF) and the signal (f) is retained in the delay flip-flop 1 (DFF) in response to the timing clock (c). It is clear from this operation that when the enable signal (e) is equal to a logic "0", the input data and the output data of the delay flip-flop 1 (DFF) are identical to each other. That is, the data 1 is equal to the data 2, and namely, (d) is equal to (h).

As illustrated in FIG. 1, the logically synthesized logic circuit has the delay flip-flop 1 (DFF) which performs the on and off operation in response to the timing clock (c). Therefore, with such a structure, every time when each cycle of the clock timing (c) begins and finishes, the delay flip-flop 1 (DFF) repeats the on and off operation. Consequently, the power consumption becomes large.

In this event, it is preferable to reduce the on and off operation of the delay flip-flop 1 (DFF) in order to reduce the power consumption. Taking this into consideration, the circuit according to this invention is automatically changed into a gated clock circuit so as to suppress a change due to the clocks (c) when the above-mentioned expression is used.

Referring to FIG. 2, the multiplexer 1 (MUX) is removed and the delay flip-flop 1 (DFF) is left in the logic circuit which is formed by the use of the gated clock. Further, the data 1 (d) is directly given to the delay flip-flop 1 (DFF) in the circuit illustrated in FIG. 2. On the other hand, the enable signal (e) and the timing clock (c) are given to an OR gate OR1 4 and are supplied to the delay flip-flop 1 (DFF) via the OR gate OR1 4.

In the circuit changed as illustrated in FIG. 2, only when the enable signal (e) is equal to a logic "0", the timing clock (c) is given to the delay flip-flop 1 (DFF). When the enable signal (e) is equal to "1", namely, (d) is given to the delay flip-flop 1 (DFF) and the delay flip-flop 1 (DFF) does not perform the on and off operation in response to the timing clock (c). Consequently, the on and off operations of the delay flip-flop 1 (DFF) can be remarkably reduced. Therefore, the power consumption can be also reduced. Thus, this invention is characterized in that the invention has the logic synthesis tool for automatically changing the logically synthesized logic circuit illustrated in FIG. 1 into the logic circuit illustrated in FIG. 2

As mentioned before, it is judged whether or not the gated clock illustrated in FIG. 2 can be automatically extracted in the circuit design method according to this invention. When the gated clock is extracted, the circuit in FIG. 2 which is formed by the use of the gated clock is generated.

Subsequently, referring to FIG. 3 together with FIG. 1, description will be made about the circuit design, method according to an example of this invention.

In a flow chart illustrated in FIG. 3, the flip-flop (hereinafter, abbreviated to FF) which is formed by the use of the gated clock will be extracted.

First, it is detected whether or not the operation is completed for all of FFs in the step S1.

If the operation for all of FFs is not completed in the step S1, the step S1 goes to the step S2 to select FF. Herein, the selected FF is represented by g in the step S2.

Next, a logic function of an input f is produced with respect to the selected g in the step 3.

In the case of the delay flip-flop 1 (DFF) illustrated in FIG. 1, the logic function with respect to the input f can be represented by the following equation.

$$f = e \cdot h + eb \cdot d$$

Herein, e and eb are the enable signal and a Not enable signal (called an enable bar signal) thereof, respectively. Further, h is an output signal of g while d is a data signal (data 1).

Subsequently, it is judged whether or not the output signal h of g is included in the logic function with respect to the output f in the step S4. As a result of the judgement, if h is included, the step S4 proceeds to the step S5. If h is not included, the process returns to the step S1. In the illustrated example, the process proceeds to a calculation process of a co-factor in the step S5 and the latter because h is included in the logic function with respect to the input f. The co-factor can be calculated by inputting a logic "1" and a logic "0" as e and eb.

Specifically, the co-factor can be calculated by the use of the following equation.

$$f(eb) = 0h + 1d = d$$

Figure 3:
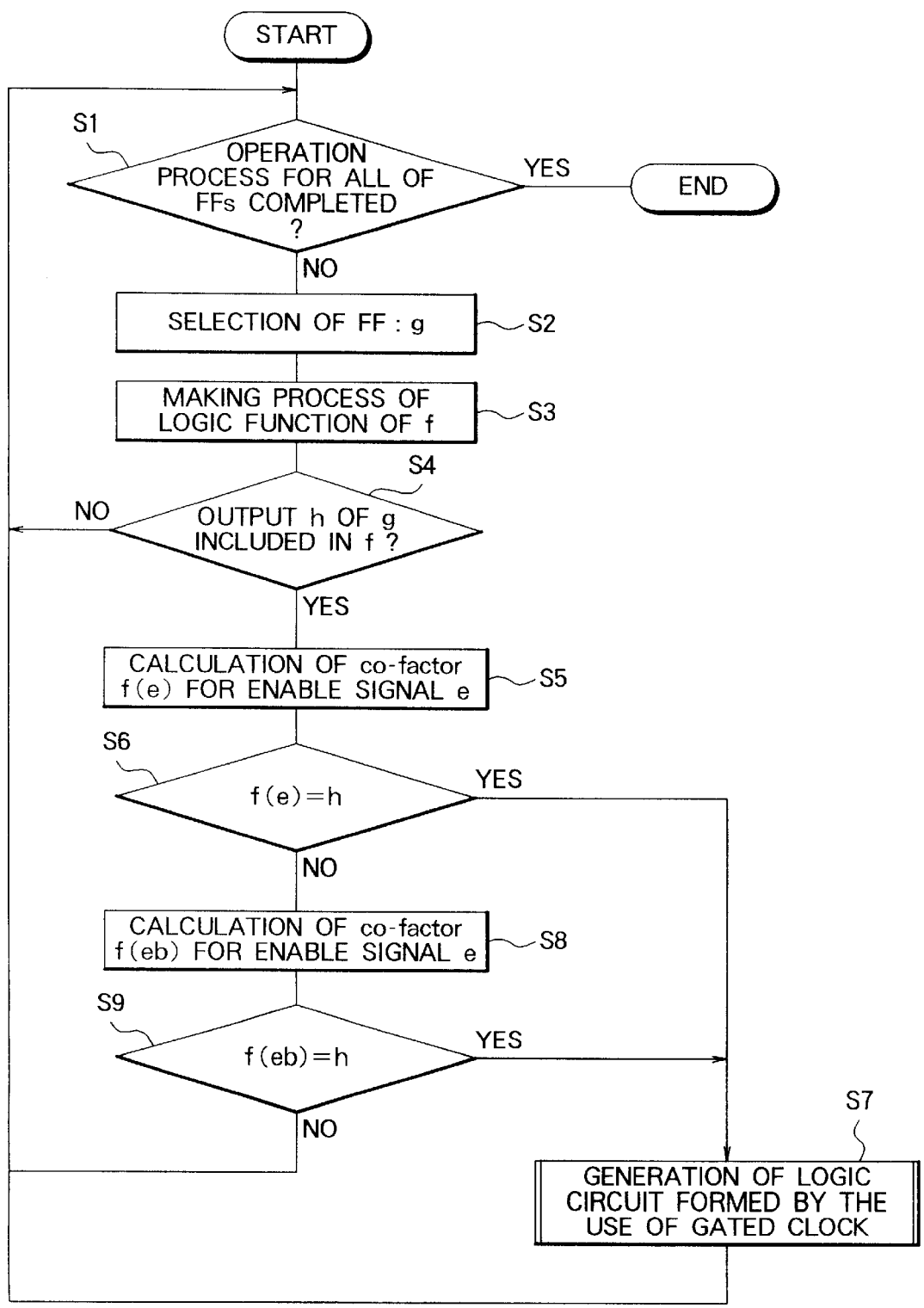
FIG. 3 is a flow chart for explaining a circuit design method according to an example of this invention.

In FIG. 3, after the co-factor is calculated, the operation process transfers from the step S5 to the step S6.

In the step S6, it is judged whether or not a relation of f(e)=h is satisfied. In this example, the operation process transfers from the step S6 into the step S7 to generate the logic circuit which is formed by the use of the gated clock because the above condition is satisfied.

On the other hand, when the above co-factor does not satisfy the above-mentioned condition in the step S6, the operation process goes to the step S8 to calculate the co-factor for the enable signal eb based upon the following equation.

$$f(eb) = 0d + 1d = d$$

Successively, judgement is made about whether or not a relation of f(eb)=h is satisfied in the step S9. In this example, the step 9 is returned back to the step S1 to select another flip-flop and to repeat the same operation because the above relation is not satisfied in the step S9. This operation is carried out for all of the flip-flops until all of the logic circuits which are formed by the use of the gated clock are generated.

In the above-mentioned example, description has been made about the extracting operation of the gated clock in a single hierarchy. Alternatively, the extracted gated clock logic circuits may be combined into a hierarchy of a higher level. Thereby, a single logic circuit which is controlled by a single enable signal e and a single clock c may be combined.

Figure 4:
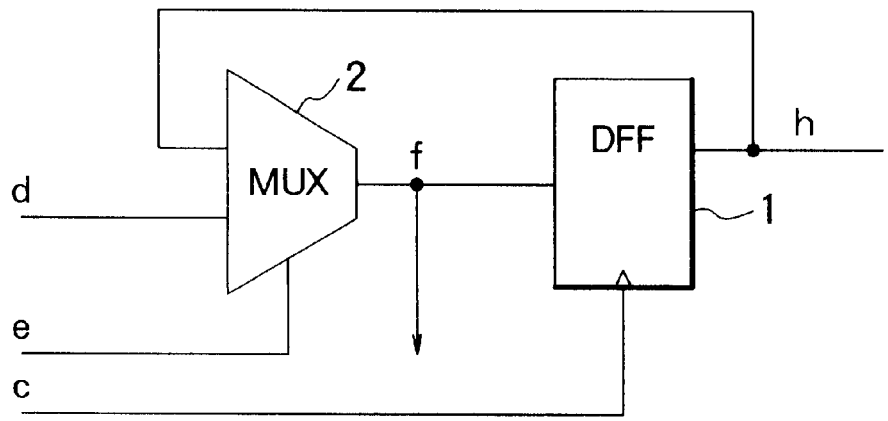
FIG. 4 is a circuit diagram for explaining a circuit which requires a logic regeneration process according to this invention.

Subsequently, when the gated clock logic circuit is generated as shown in the step S7 in FIG. 3, it is required that the input f for the selected flip-flop g is single. For instance, when the signal f which is obtained by logically calculating the enable signal e and the output h of the delay flop-flop 1 (DFF) is branched or fanned out to other than the delay flip-flop 1 (DFF) as illustrated in FIG. 4, the gated clock illustrated in FIG. 2 is not accurately and logically synthesized. Thus, when the above branch exists, a pretreatment process must be carried out to equivalently constitute the circuit illustrated in FIG. 1.

Figure 5:
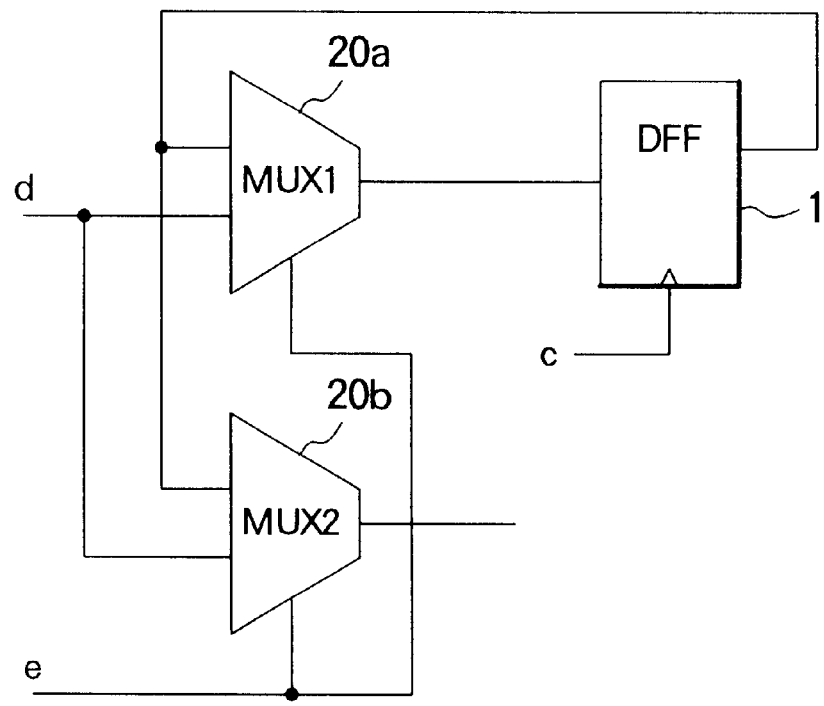
FIG. 5 is a circuit diagram for explaining the logic regeneration process which is performed for the circuit illustrated in FIG. 4.

Referring to FIG. 5, description will be made about the logic regeneration process executed when the signal f which is logically calculated has additional loading or a larger fanout.

For example, the multiplexer (MUX) 2 illustrated in FIG. 4 is doubled to form the structure of a multiplexer 20a (MUX1) and a multiplexer 20b (MUX2) which are equivalent to each other. In this event, the multiplexer 20a (MUX1) and the delay flip-flop 1 (DFF) is formed by the use of gated clock in the same manner with FIG. 2. On the other hand, a circuit (not shown) which is connected to the multiplexer 20b (MUX2) may deal with the other logic circuit.

Moreover, when the gated clock logic circuit is generated, it is desirable that consideration is made about a case that the data d is stored to the flip-flop g which is selected at the rise of the clock and another case that the data d is stored to the flip-flop g which is selected at the fall of the clock. Further, another consideration may be preferably made about a case that the enable signal e is sometimes equal to a logic "1" or "0".

Figure 6:
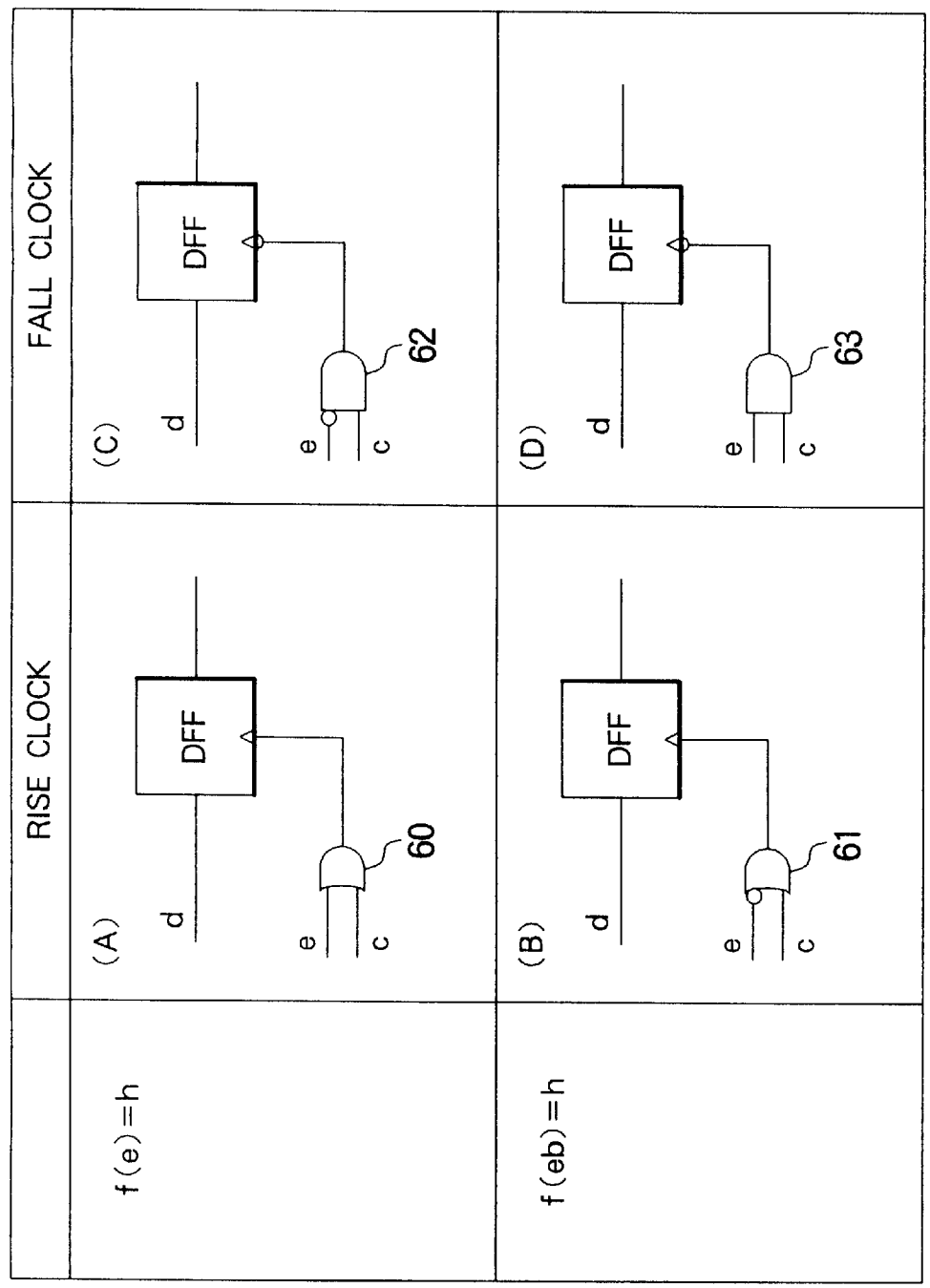
FIG. 6 is a circuit diagram for explaining variation of logic circuits which are formed by the use of a gated clock process and which are generated according to this invention.

In FIG. 6, a structure of a logic circuit which stores the data d on the basis of the rise clock is illustrated in a first column. On the other hand, a structure of a logic circuit which stores the data d on the basis of the fall clock is illustrated in a second column. In this case, even when the data d is stored in response to the rising clock, the logic circuit which satisfies the condition of f(e)=h and the logic circuit which satisfies the condition of f(eb)=h are structured, respectively. Therefore, four logic-circuits which correspond to the respective conditions and clocks are illustrated in FIG. 6.

More specifically, when the data d is stored in response to the rise clock and the condition f(e)=h is satisfied, the gated clock logic circuit (thereinafter, referred to as a logic circuit A) can be obtained by using an OR gate 60 between the enable signal e and the timing clock c in the same manner with FIG. 2. Further, when the date d is stored in response to the rise clock and the condition f(eb)=h is satisfied, the corresponding logic circuit (thereinafter, referred to as a logic circuit B) can be obtained by inputting Not signal (namely, eb) of the enable signal e to the OR gate 61.

Moreover, the logic circuit which stores the data d in response to the fall clock and satisfies the condition of f(e)=h can be formed by the use of the gated clock via an AND gate 62 which is given the enable bar signal eb of the enable signal e and the clock c, and is thereinafter called a logic circuit C. In addition, the logic circuit which stores the data d in response to the fall clock and satisfies the condition of f(eb)=h can be formed by the use of gated clock via an AND gate 63 which is given the enable signal e and the clock c, and is thereinafter called as a logic circuit D.

Figure 7:
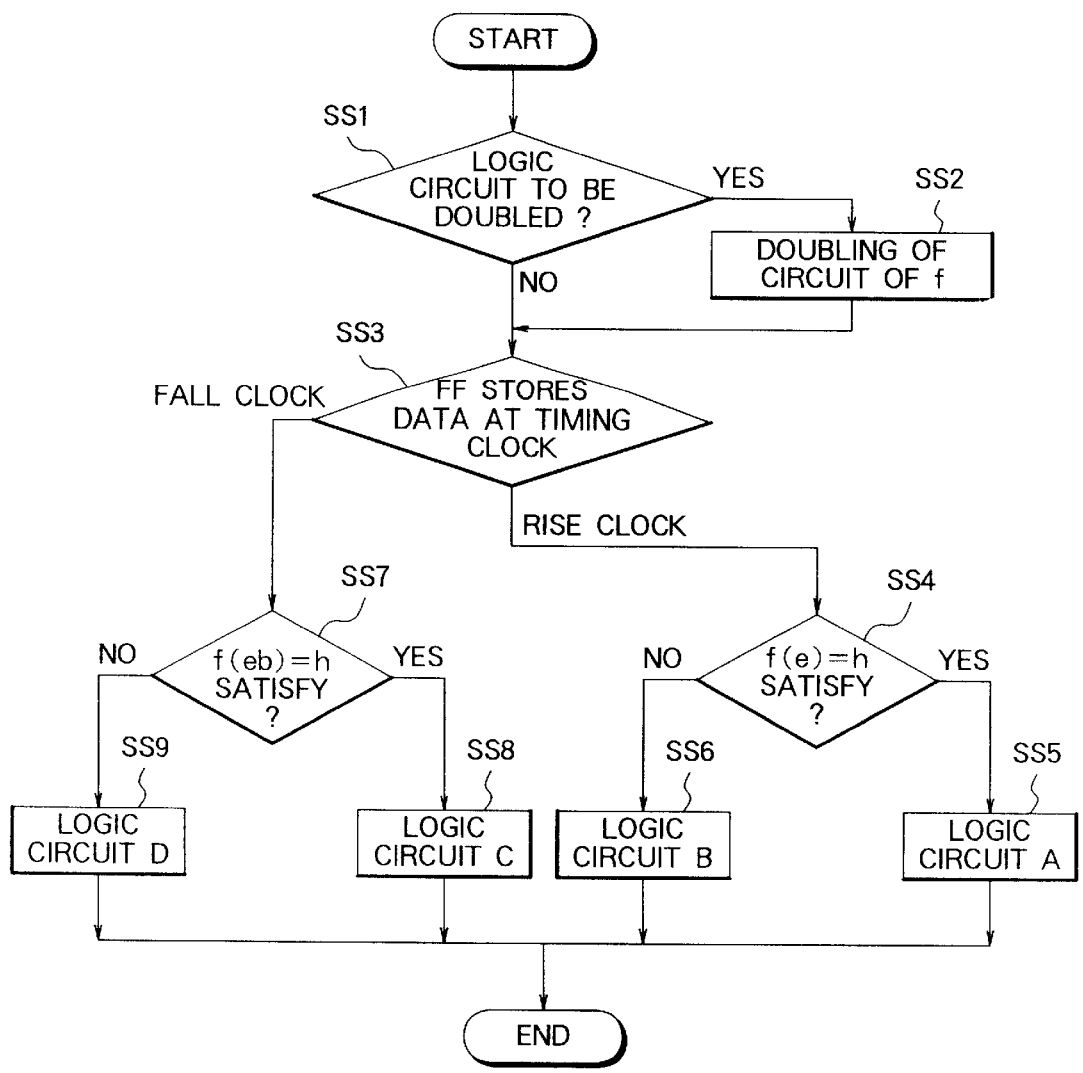
FIG. 7 is a flow chart for explaining an operation for generating a logic circuit which is formed by the use of a gated clock process according to this invention.

Referring to FIG. 7, detail description will be made about the operation of the step S7 for generating the gated clock logic circuit in FIG. 3.

Referring to FIG. 7, description will be made about the operation for performing the logic regeneration process shown in FIGS. 4 and 5 and obtaining either one of the gated clock logic circuits A through D in FIG. 6.

First, it is judged whether or not the logic circuit is required to be doubled in the step SS1. This judgement can be easily carried out by detecting whether or not the signal f is branched or fanned out. When the logic circuit is required to be doubled, the circuit with respect to the signal f (for example, the multiplexer MUX) is doubled in the step SS2.

When the circuit is doubled, the process transfers to the step SS3. On the other hand, the circuit is not required to be doubled, the process directly goes to the step SS3.

Next, it is judged whether or not the selected flip-flop (FF) stores the data at either one of the rise and the fall of the timing clock in the step SS3. As a result of the judgement, when the data is stored at the rise clock, the step SS4 is successively carried out after the step SS3.

In the step SS4, it is judged whether or not the condition of f(e)=h is satisfied. When the condition is satisfied, the logic circuit A illustrated in FIG. 6 in is determined in the step SS5. On the other hand, when the above condition is not satisfied, the logic circuit B in FIG. 6 is determined in the step SS6.

On the other hand, when it is judged that the data is stored at the fall clock of the flip-flop (FF) in the step SS3, the process operation transfers to the step SS7. In the step SS7, it is judged whether or not the condition of f (eb)=h is satisfied. When this condition is satisfied, the logic circuit C illustrated in FIG. 6 is determined in the step SS8. Further, when the above condition is not satisfied, the logic circuit D in FIG. 6 is determined in the step SS9.

Above mentioned before, the gated clock logic circuits are sequentially and automatically determined according to this invention. Consequently, a manual adjustment can be remarkably simplified.

What is claimed is:

1. A method of generating a logic circuit formed by using a gated clock and extracted flip-flops for the logic circuit, comprising:

(a) selecting a flip-flop represented by g;

(b) producing a logic function for determining an input f with respect to the selected flip-flop g, said logic function being represented by the following equation $$f=e \cdot h + eb \cdot d$$

wherein e and eb are an enable signal and a NOT enable signal respectively while h is an output signal of the selected flip-flop g and d is a data signal;

(c) judging whether or not the output signal h is included in the logic function;

(d) calculating a first co-factor f e) for the enable signal e if h is included as a result of the judgement;

(e) judging whether or not a relation of f(e)=h is satisfied;

(f) generating said logic circuit formed by using the gated clock if the relation is satisfied;

(g) calculating a second co-factor f(eb) for the NOT enabled signal eb based if the relation is not satisfied;

(h) judging whether or not a relation of f(eb)=h is satisfied;

(i) generating the logic circuit formed by using the gated clock if the relation is satisfied; and (j) selecting another flip-flop if the relation is not satisfied.

2. A method as claimed in claim 1, wherein the first co-factor is calculated by inputting a logic "1" and a logic "0" as e and eb, respectively, of said function for determining said input f.

3. A method as claimed in claim 2, wherein:

the second co-factor is calculated by inputting a logic "0" and a logic "1" as e and eb, respectively, of said function for determining said input f.

4. A method as claimed in claim 1, wherein:

steps (a)–(j) are carried out for a plurality of flip-flops until each of a plurality of logic circuits formed by the use of gated clock signals are generated.

5. A method as claimed in claim 4, wherein:

the plurality of logic circuits are combined into a hierarchy of a higher level.

* * * * *